United States Patent [19]

Kosugi et al.

[11] Patent Number: 5,450,046

[45] Date of Patent: Sep. 12, 1995

[54] COMPOSITE MICROWAVE CIRCUIT MODULE ASSEMBLY AND ITS CONNECTION STRUCTURE

[75] Inventors: Yuhei Kosugi; Osamu Yamamoto; Hiroaki Izumi; Hideki Kusamitsu; Shin-ichi Omagari; Hideo Watanabe; Yoshio Minowa, all of Tokyo, Japan

[73] Assignee: NEC Corporation, Tokyo, Japan

[21] Appl. No.: 142,099

[22] Filed: Oct. 28, 1993

[30] Foreign Application Priority Data

Oct. 29, 1992 [JP] Japan .................. 4-291005
Oct. 29, 1992 [JP] Japan .................. 4-291031

[51] Int. Cl.⁶ .......................................... H03H 11/02
[52] U.S. Cl. ........................... 333/246; 333/247; 333/26; 333/99 R; 361/761; 361/816; 455/128
[58] Field of Search ............... 333/26, 246, 247, 260; 361/735, 761, 764, 778, 792, 794, 795, 800, 816; 332/164; 455/128; 257/664, 728

[56] References Cited

U.S. PATENT DOCUMENTS

| | | | |
|---|---|---|---|
| 3,483,489 | 12/1969 | Dietrich | 333/21 R |
| 4,498,122 | 2/1985 | Rainal | 361/794 |
| 4,630,172 | 12/1986 | Stenerson et al. | 361/761 X |
| 4,745,381 | 5/1988 | Kosugi et al. | 333/245 |
| 4,821,007 | 4/1989 | Fields et al. | 333/238 |
| 4,916,417 | 10/1990 | Ishikawa et al. | 333/238 X |
| 5,045,820 | 9/1991 | Leicht et al. | 333/26 |
| 5,151,769 | 9/1992 | Immorlica, Jr. et al. | 257/659 |
| 5,206,986 | 5/1993 | Arai et al. | 361/816 X |
| 5,235,208 | 8/1993 | Katoh | 333/247 X |
| 5,255,158 | 10/1993 | Kosugi | 361/761 X |

FOREIGN PATENT DOCUMENTS 0408228 1/1991 European Pat. Off. .
0503200 9/1992 European Pat. Off. .
2284195 4/1976 France .

OTHER PUBLICATIONS

By R. Pucel, "Design Considerations for Monolithic Microwave Circuits", Jun. 1981, vol. 29, No. 6, IEEE Trans. on Microwave Theory and Techniques, pp. 513–534, New York, USA.

*Primary Examiner*—Paul Gensler
*Attorney, Agent, or Firm*—Young & Thompson

[57] ABSTRACT

A composite microwave circuit module assembly has a dielectric substrate which is formed by a lower layer, an intermediate layer and an upper layer. The lower layer and the upper layer include a lower ground surface and an upper ground surface, respectively, and the intermediate layer includes a radio frequency signal circuit formed by an active circuit element and a passive circuit element. A number of via-holes filled with metal are arranged along the radio frequency signal circuit to short-circuit the upper ground surface and the lower ground surface so as to shield the radio frequency signal circuit. An element mounting cavity is disposed on the intermediate layer with a portion of dielectric above the intermediate layer being removed, and the active circuit element is mounted on an element mounting land in the cavity. The cavity is covered by a conductor plate member. A connection terminal connected with the radio frequency signal circuit is provided in a surface of the dielectric substrate without projecting from the surface thereof and allows external electrical connection thereat from outside by a microwave circuit connection structure having a contact member resiliently urged toward said connection terminal.

17 Claims, 11 Drawing Sheets

COMPOSITE MICROWAVE CIRCUIT MODULE ASSEMBLY AND ITS CONNECTION STRUCTURE

BACKGROUND OF THE INVENTION

1. Field of the Invention

The present invention relates to a composite microwave circuit module assembly, and more particularly to a composite microwave circuit module used for microwave communication apparatuses and to a connection structure for connecting such a microwave circuit module to a module of the same configuration or other external circuitry.

2. Description of the Related Art

Figure 1:
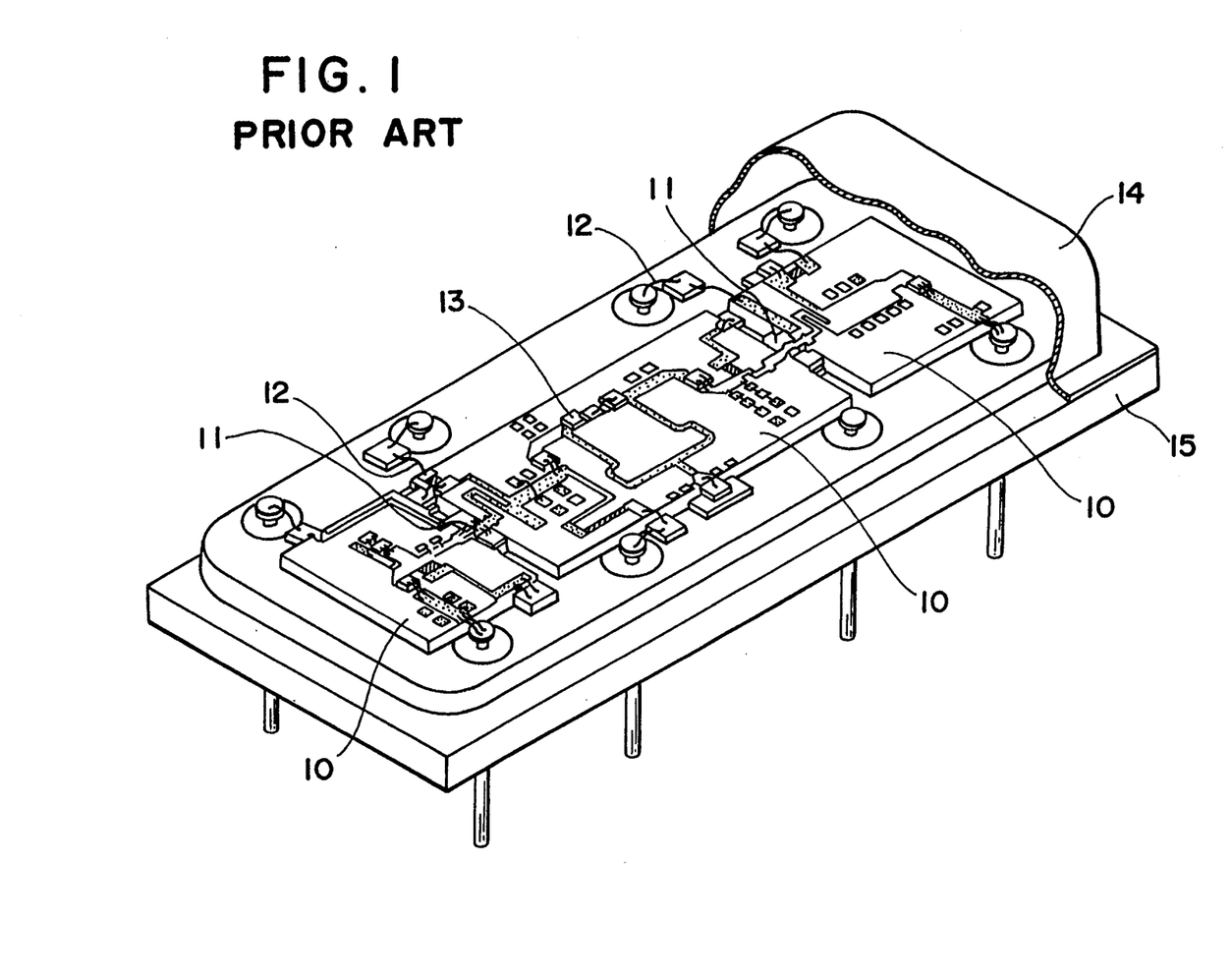
FIG. 1 is a perspective view of a conventional microwave circuit module.

In a prior art microwave circuit module, as shown in FIG. 1, a circuit substrate 10, which comprises a film conductor formed on a dielectric substrate of alumina ceramics or the like, is disposed on each lateral side of an active element 11 for connecting the active element with a small interval therebetween. That is, the prior art microwave circuit module has a plurality of circuit substrates 10. Further, the module has many connection lines such as wire bondings 12 for the connection of these circuit substrates 10. A single-layer parallel-plate capacitor 13 acting as a coupling capacitor is mounted on the circuit substrate 10 and connected by means of wire bonding. Further, a resistor element is formed as a thin film of tantalum nitride or the like only on the surface of the circuit substrate 10. Further, to protect the active elements from the outside, a metal cap 14 is completely bonded to a case base (generally referred to as "header") 15 by means of resistance welding. The metal cap 15 also serves the role of a shield to prevent leakage of radio-frequency (RF) signals to the outside.

As described above, the prior art microwave circuit module requires a plurality of circuit substrates 10 and components such as single-layer parallel-plate capacitors 13, which have been presenting problems in promoting the structural simplification and size reduction in a mounting structure. In addition, an increased number of points of connection of many components has led to deterioration of the RF characteristics and has required a large number of assembling steps, thus making it difficult to reduce manufacturing cost.

In recent years, Microwave Monolithic Integrated Circuit (hereinafter referred to as "MMIC") are finding practical applications. Even the MMIC, however, has limitations imposed on its applications. The MMIC is usually formed on a Si (silicon) or GaAs (gallium arsenide) wafer by using semiconductor manufacture techniques based on the photolithographic technology. Although lumped constant circuit elements such as transistors and diodes which are active elements are small in scale, distributed constant circuit elements such as directional couplers and filters which are passive elements are large in scale and pose problems when assembling them in the MMIC. Large scale chips are disadvantageous in view of the yield of manufacture and cost. Therefore, conventional MMIC chips have not included therein large scale passive circuit elements as noted above.

Since the MMIC is unsuited for the assembling of the passive circuit elements, in the prior art microwave circuit, the active elements are accommodated in a small size air-tight sealing case while constructing the remaining connection lines and the passive circuit elements with microstrip lines, and these components are connected to one another by means of soldering. For shielding such components and connection lines from external circuits, a complicated and expensive shield case with a plurality of small chambers formed by partitioning is necessary.

The prior art connection structure is applicable to modules of the type in which only active elements are accommodated and lead terminals thereof project for soldering.

However, there is a demand for compact composite microwave circuit modules which also accommodate passive elements. Since passive elements are large in scale, the provision of such elements in the module increases the module area or dimension and manufacturing cost.

With the prior art structure of connecting together composite microwave circuit modules by soldering, it has not been possible to make an effective reduction in the number of processing steps and an effective improvement in the stability of the radio frequency connection performance.

SUMMARY OF THE INVENTION

An object of the present invention is to overcome the problems existing in the prior art and to provide an improved composite microwave circuit module which accommodates not only active elements but also passive elements and which has a terminal for connection with other modules or devices that does not project but allows external connection by use of a microwave circuit connection structure having a specially arranged contact member to be in contact with the terminal of the module.

According to the invention, active elements and divided substrates as noted in the prior art for connecting these elements are unified into a multi-layer substrate by means of wiring patterns, thus enabling to eliminate the deterioration of characteristics caused by connection and to reduce the assembling steps.

Further, the interference due to inter-circuit coupling resulting from a plurality of microwave circuits being accommodated in a common case and the resonance of the case as cavity can be avoided with a shield structure or a cavity structure accommodating active elements, and unification and integration including those of peripheral circuits can be obtained, thus reducing many of the packaging hierarchy that have heretofore been necessary. This permits reduction of the size and manufacturing cost of the module.

The present invention permits advancing MMIC techniques which have heretofore been unsuited for the incorporation of passive elements and realizing a microwave circuit module which has enabled larger scale integration including passive elements and lines.

The features of the invention relating to the composite microwave circuit module include the following:

A structure, in which a dielectric layer above an intermediate layer portion for RF signal transmission is formed with a cavity as an element-mounting place, a semiconductor element such as an MMIC is mounted in the cavity, and a ground surface portion which has been removed is covered by a conductive plate (cavity structure).

A structure, in which an air-tight seal is realized with the conductive plate to protect a mounted semiconductor chip from contamination from the outside (seal structure).

A structure, in which a conductor land (an element-mounting surface) is provided in the intermediate layer portion and connected to a lower layer ground surface via a plurality of VIA holes (for the reduction of RF impedance), and the VIA holes are filled with a metal to reduce thermal resistance with respect to the lower layer and to obtain effective heat conduction. A structure, in which the VIA holes are provided right underneath a local heat generation spot such as a transistor region in a semiconductor chip for thermal resistance reduction (chip mounting structure, thermal VIA).

A structure, in which a plurality of conductor layer lands are provided as alternate capacitor and ground lands between an element-mounting surface of the intermediate layer portion and a lower ground layer, with the capacitor lands connected together and the ground surface and the ground lands connected together via VIA holes, thus forming a laminate capacitor which functions as a bypass capacitor for a mounted element (mounted chip), while dispersing heat laterally through the laminated conductor layer lands to reduce the thermal resistance (electric and thermal bypass structure).

A structure, in which the intermediate layer portion is provided with a very thin dielectric layer which forms, together with the conductor patterns on both sides of such dielectric layer, capacitive coupling, thus forming a transmission line to cut direct current (DC) component (RF capacitor structure).

A structure, in which a dielectric layer is formed on an upper ground layer with conductor patterns formed thereon as wiring patterns to obtain power supply wirings (DC wiring structure).

A structure, in which, at a portion connected to inner layers, a land is provided to form together with the ground layer right beneath the land a capacitor as a bypass capacitor to prevent RF leakage from the inner layers.

A structure, in which each of the inner layers is provided with distributed small holes (cavities) formed by removing dielectric to reduce the effective dielectric constant (effective dielectric constant reduction structure).

A structure, in which the small holes are shifted in position for each layer to avoid overlap, thus providing for increased mechanical strength of the substrate.

A structure, in which the outer periphery of the multi-layer substrate is also metalized with conductor to form a ground surface (metalized shield structure on outer periphery).

A structure, which has a metal base for heat spread and mechanical reinforcement.

Figure 10:
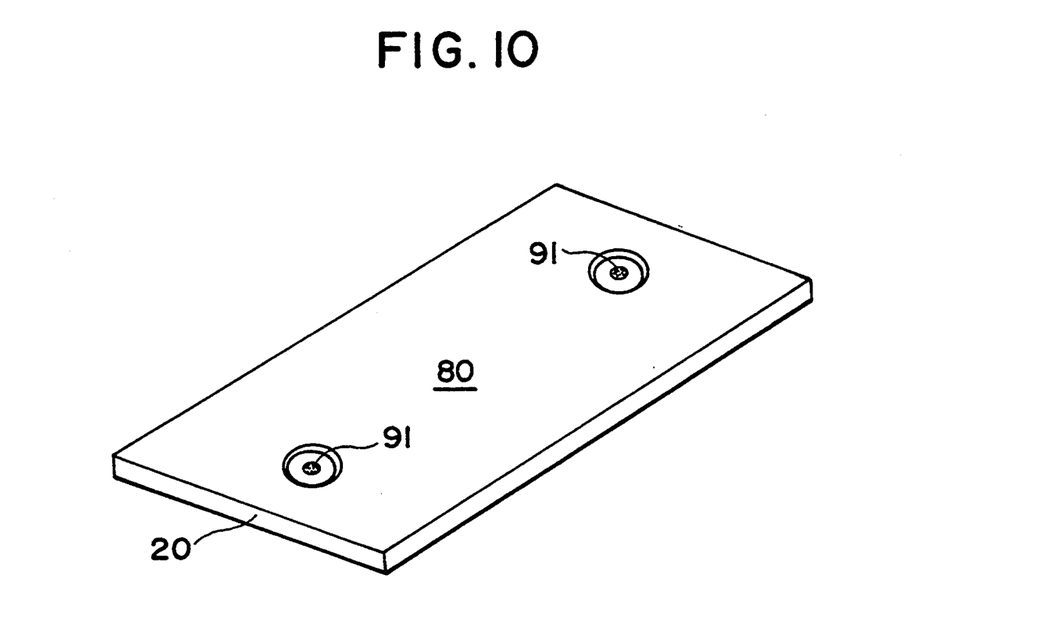
FIG. 10 is a perspective view of a back of a microwave circuit module of an embodiment according to the invention.

The microwave circuit module thus formed has no terminal pins or the like that project outward for connection to external circuitry. Instead, there is provided in the back surface of a base plate portion with a recess (as seen in FIG. 10) in which the connection terminal is disposed without projecting from the back surface. The microwave circuit connection structure used with the module has a contact member to be in contact with the above connection terminal.

Therefore, according to another aspect of the invention, in addition to that described above, there is provided, for the connection between the composite microwave circuit module and other external circuitry, a microwave circuit connection structure which has a contact member being resiliently urged to the connection terminal of the module.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF PREFERRED EMBODIMENTS

Now, preferred embodiments of the invention will be explained with reference to the accompanying drawings.

Figure 2:
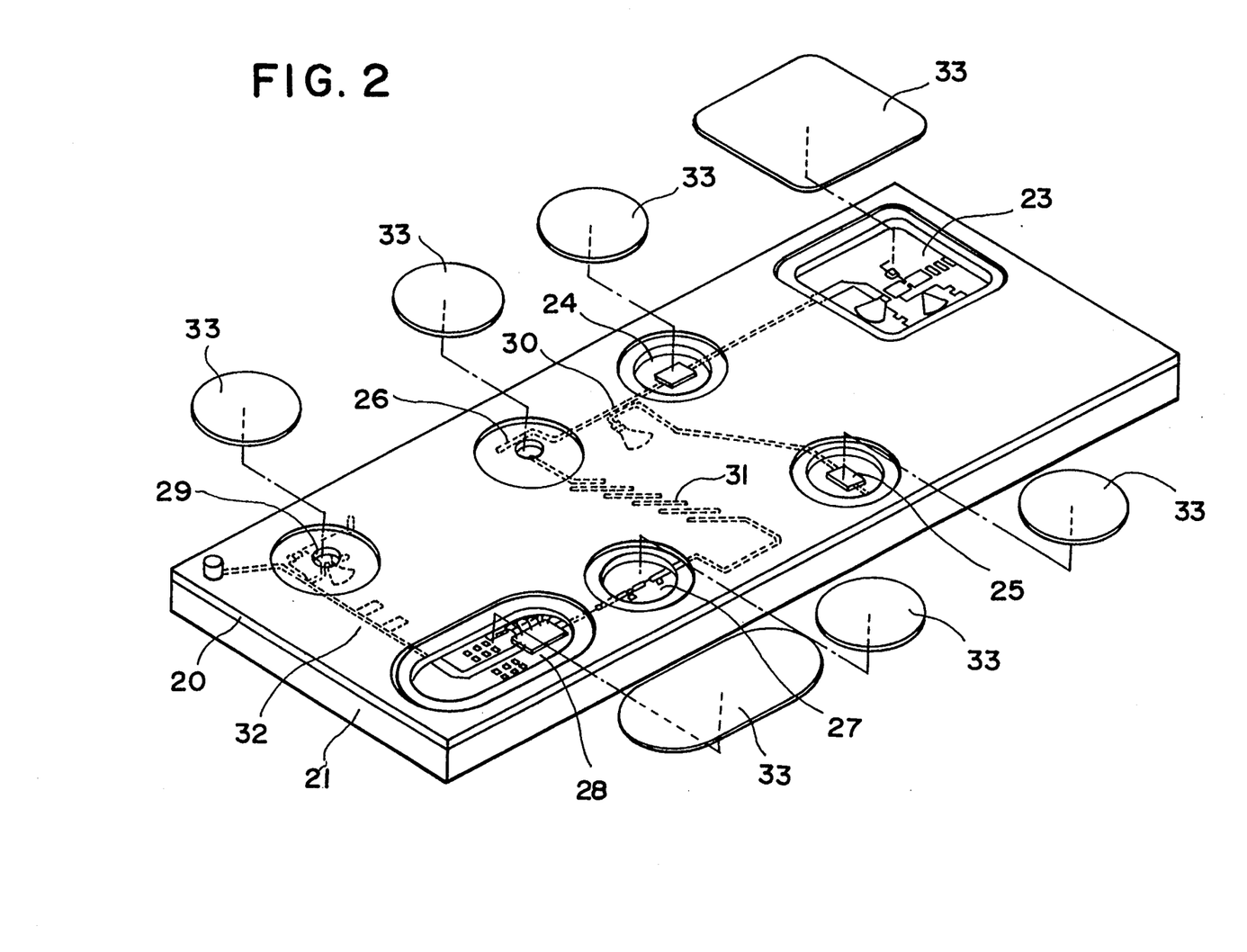
FIG. 2 is a perspective view partly exploded, showing a structure of an embodiment according to the invention.

FIG. 2 shows in perspective view an embodiment of the invention. A dielectric substrate 20 comprising a lamination of layers of ceramics or the like is welded to a metal base plate 21. In the substrate 20 there are accommodated such active circuits as a voltage-controlled oscillator (VCO) 23, an amplifier (AMP) 24, a pre-scaler (PSC) 25, a mixer (MIX) 26, a variable attenuator (ATT) 27, a power amplifier (PA) 28, and a detector (DET) 29 formed by such active elements as MMIC, IC, transistor, and diode, and there are also accommodated such passive circuits as a directional coupler (DC) 30, a band-pass filter (BPF) 31 and a low-pass filter (LPF) 32 formed by such elements as a strip line, a microstrip line and a coplanar line. These circuits are electrically coupled or connected to one another, and the active circuit part is shielded by a conductive cap (CAP) 33, thereby constituting a composite circuit module. In the module shown in FIG. 2, unlike in the prior art, there are no terminal pins projecting outward for connection to external circuitry, and there is formed a recess in the back surface of the module with a connector structure provided therein as shown in FIG. 10. The connector structure, which is fully explained later, has spring loaded external connection pins and the connection to the external circuitry is achieved via such connector structure.

Figure 3:
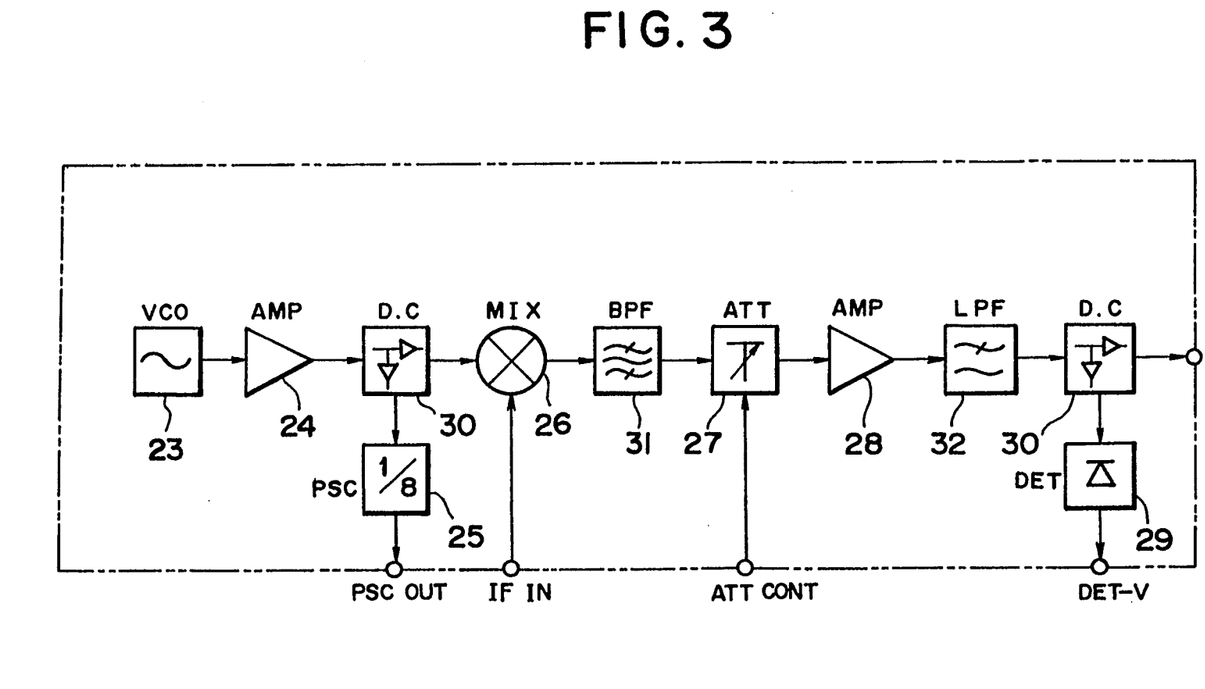
FIG. 3 is a functional system diagram of the embodiment shown in FIG. 2.

FIG. 3 is a functional system diagram of the embodiment of the invention shown in FIG. 2. The diagram shows a general configuration of an RF modulator of a microwave transmitter. The operation of this module will now be described. The output of the voltage-controlled oscillator (VCO) 23 is amplified by the amplifier (AMP) 24 before being coupled to the mixer (MIX) 26. The first directional coupler (DC) 30 also couples the output of the amplifier (AMP) 24 to the pre-scaler (PSC) 25 for frequency division before being outputted to the frequency monitoring terminal (PSC OUT). An intermediate frequency (IF) signal from an IF signal input terminal (IF IN) is coupled to the mixer 26 for frequency conversion to produce an output coupled to the band-pass filter (BPF) 31 for rejection of unnecessary frequency components. The resultant signal is coupled to the variable attenuator.(ATT) 27 for level control before being coupled to the power amplifier (PA) 28 for amplification. The output of the power amplifier (PA) 28 is coupled to the low-pass filter (LPF) 32 for rejection of harmonic frequencies. The resultant output is passed through the second directional coupler (DC) 30 to be outputted from an RF signal output terminal (RF OUT). A part of the output signal is also coupled to the detector (DET) 29 to be outputted as a level monitoring signal from a detection signal output terminal (DET-V).

Figure 4:
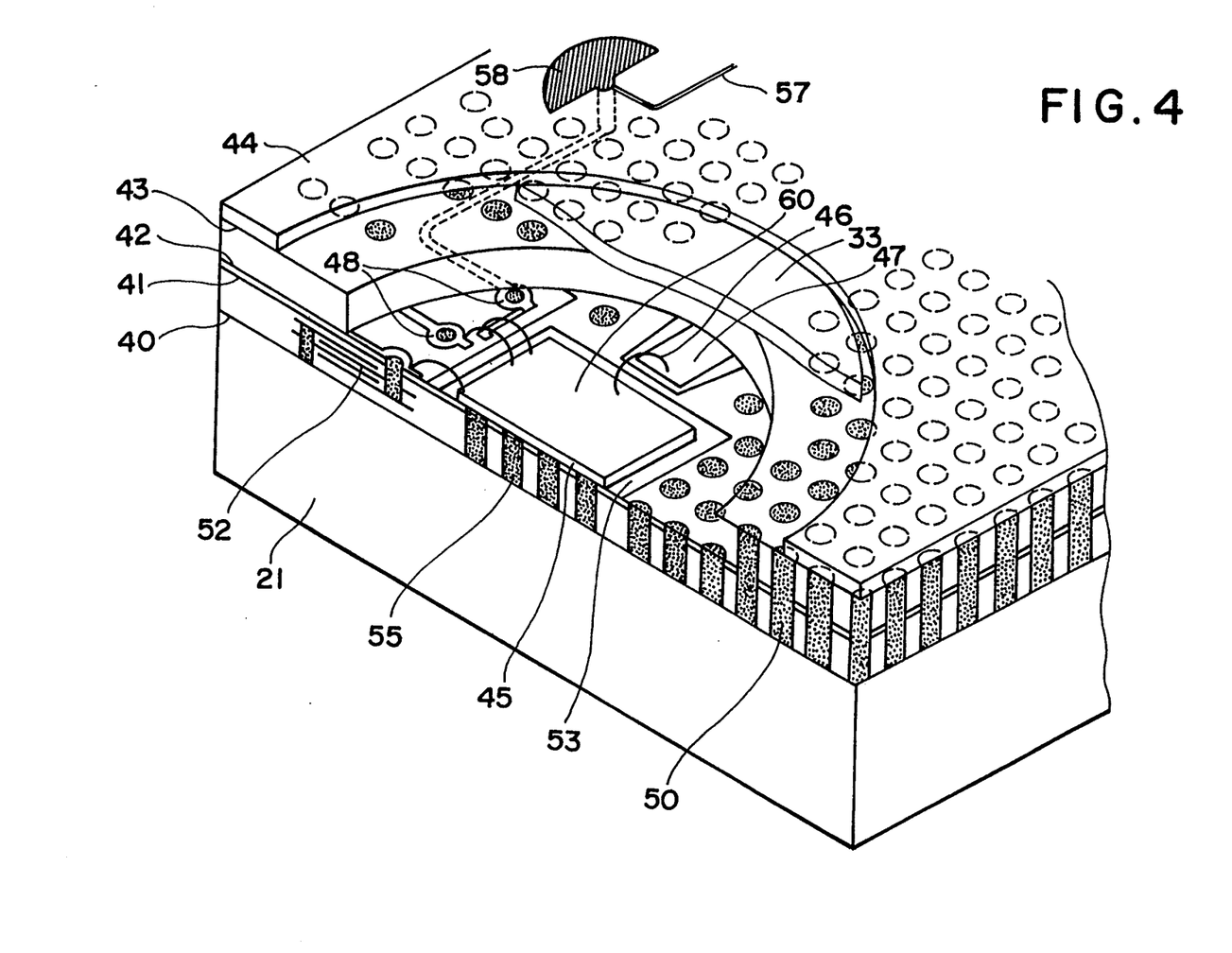
FIG. 4 is a perspective view, partly in section, of a structure of an embodiment according to the invention, intended to illustrate a layered structure of module and a cavity structure with active elements.

FIG. 4 shows in detail an example of the method of forming a layered structure of a composite microwave circuit module and a cavity structure according to the invention. The layered structure includes a lower layer ground surface 40, intermediate RF signal layers 41 and 42, an upper layer ground surface 43, and a wiring layer 44 for a power source and signals such as a bias signal other than RF signals.

A cavity section 60 is formed by removing the dielectric above the intermediate layers for RF signal transmission, and an active functional element 45 such as an MMIC is mounted therein by means of die bonding and connected by bonding wire 46 (or TAB technique) to a signal pattern 47 or a power source pattern 48.

The upper layer ground surface exposed by removing the dielectric for forming the cavity 60 is covered by a conductive cap CAP 33 and electrically shielded. The overall portion outside the cavity is provided with a number of VIA holes 50, through which the ground surfaces of the respective lower and upper layers 40 and 43 are interconnected, whereby a shield effect of minimizing the inter-circuit coupling in the module and also minimizing the coupling to the external circuitry is achieved. In order to reduce the impedance of the power source line, there is provided in an inner layer a laminated capacitor (LC) 52 as a bypass capacitor.

A semiconductor chip is mounted on a chip mounting land 53 of conductor provided above the intermediate layers. The chip mounting land 53 is connected via a plurality of VIA holes 55 to the lower layer ground surface 40, thereby providing an element-mounting ground surface with RF impedance being effectively reduced. The VIA holes 55 are filled with a metal so as to provide a thermal VIA structure which reduces thermal resistance to the lower layer.

Figure 5:
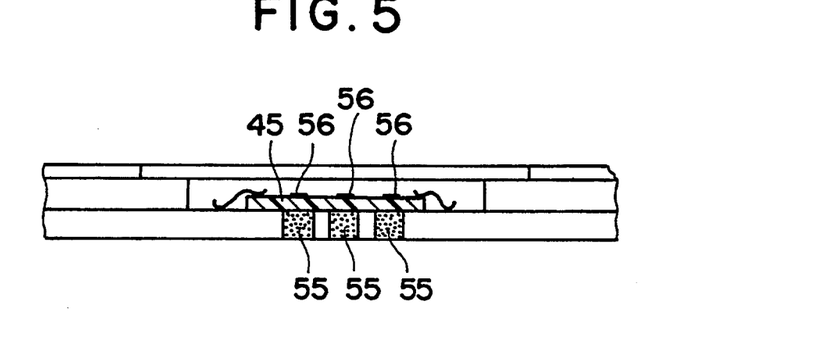
FIG. 5 is a diagram showing relative locations of heat generation spots and VIA holes in an embodiment according to the invention.

Further, as shown in FIG. 5, the thermal VIA structure may be provided right beneath a local heat generation spot 56 such as a transistor region in the semiconductor chip for further reducing the thermal resistance and enhancing the heat spreading. Further, where the heat generation in a circuit element such as a semiconductor chip is great so that it is necessary to further reduce the thermal resistance, a portion of the structure immediately beneath the circuit element may be removed to allow the circuit element to be mounted directly on the base plate 21 and, in this way, it is possible to enhance heat conduction.

The protection of a circuit element such as the semiconductor chip 45 is made by coating resin or the like on the semiconductor chip in addition to the protection by the protective film of the semiconductor itself. However, it is possible to realize an air-tight seal with the conductor CAP 33 noted above in addition to or without the resin coating for the semiconductor chip protection.

Figure 6:
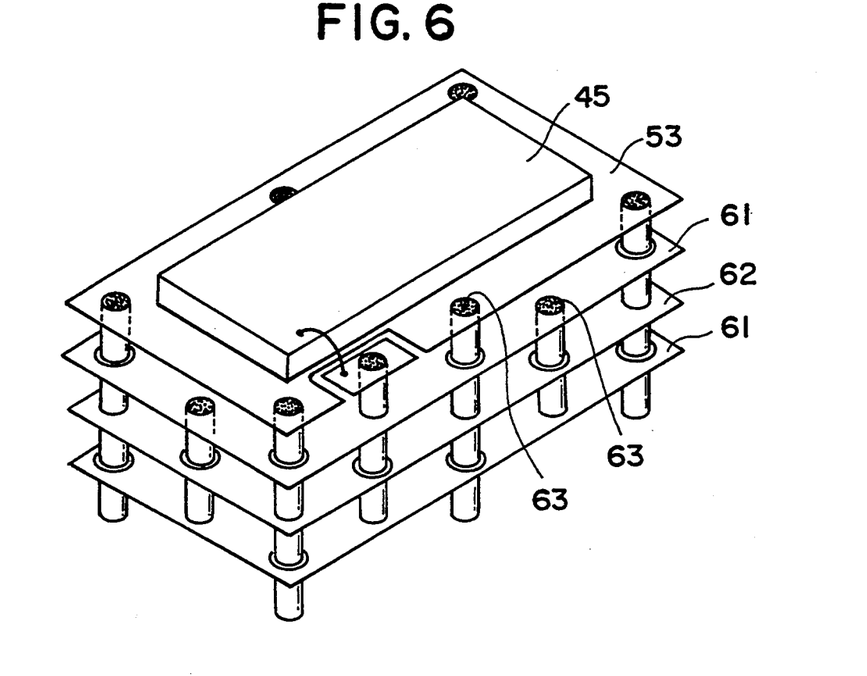
FIG. 6 is a diagram showing a current and heat simultaneous dispersion structure in an embodiment according to the invention.

Further, a structure as shown in FIG. 6 may be used, in which a plurality of conductor layer lands are provided as alternate capacitor and ground lands 61 and 62 between the chip mounting land 53 and the lower ground layer 40 with the capacitor lands 61 connected together and the ground surface 53 and the ground land 62 connected together via the VIA holes 63 to form a laminate capacitor. As this laminate capacitor is connected as a bypass capacitor to the mounted semiconductor chip 45, heat spreads laterally through the laminated conductor lands 61 and 62, whereby the thermal resistance is reduced to permit simultaneous dispersion of high frequency current and heat.

The wiring structure for signal coupling will now be described. The coupling of RF signal is mainly done with conductor patterns in the intermediate layer portion. As shown in FIG. 4, a very thin dielectric layer is provided between the RF signal layers 41 and 42 in the intermediate layer portion to form a capacitive coupling by conductive patterns on both sides of the thin dielectric layer, thus realizing a transmission line to block a DC component. In this way, decoupling between the active circuits is realized. Although the wirings for the power supply source and the control signals to each active device can be made in internal layers, an arrangement is made wherein a further dielectric layer is provided on the upper ground layer 43, and a conductor pattern 57 is formed as a lead layer for the wirings.

As the wiring layer of the conductor pattern 57 is located on a top surface of the multi-layer substrate, it has an advantage that a surface mounting device can be connected to the conductor pattern 57 so as to form a part of the circuit.

Further, as shown in FIG. 4, a land 58 may be provided at a portion where connection is made to the inner layers, thereby to form a capacitor together with the ground layer right beneath-the land 58. The capacitor thus formed serves as a bypass capacitor to prevent RF signal leakage from the inner layers.

Figure 7:
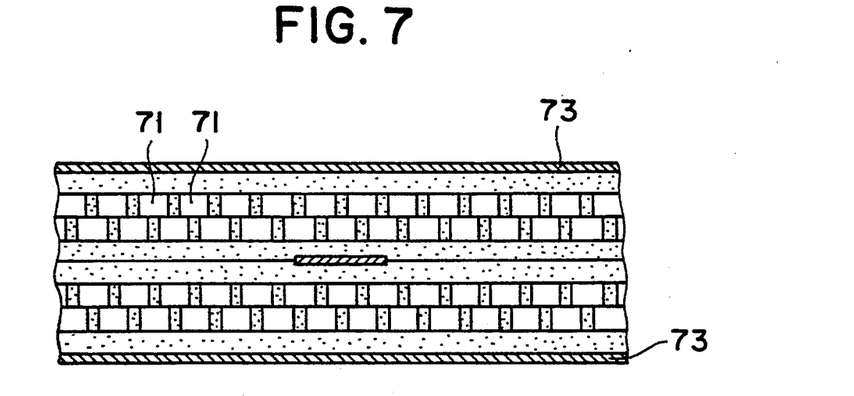
FIG. 7 is a diagram showing a structure having minute cavities formed by the removal of dielectric body in inner layers in an embodiment according to the invention.

FIG. 7 shows a further detail of the structure according to the invention. As illustrated, a number of minute cavities 71 are formed by removing dielectric such that they are distributed in each of the inner layers. This structure allows effectively lowering the dielectric constant and reducing the delay time, and reducing the circuit loss.

Further, by forming the minute cavities such that they are shifted for each layer to avoid overlap, it is possible to increase the mechanical strength of the substrate and enhance the electric homogeneity of the transmission line.

Further, with a structure, in which the peripheral surface of the multi-layer substrate is also formed with a ground surface by providing metallization 73 with a conductor, the RF circuit is entirely covered by the conductor, so that the shielding can be further enhanced. Further, it is effective to provide a metal base plate 21 on the underside of the multi-layer substrate 20 for improving the heat conduction characteristics and enhancing the mechanical strength.

As explained above, according to the invention, it is possible to greatly reduce the number of components necessary and the number of bonding wires necessary for connection, whereby both a reduction in cost of the module and an improvement in the RF characteristics are achieved.

It is thus possible to realize satisfactory shielding, to reduce inter-circuit interference and unnecessary resonance and to permit improving the required characteristics. Besides, there is no need of providing any special shield case, which contributes to the size reduction of the apparatus.

Through unification and integration inclusive of the peripheral circuits, it is possible to reduce the number of mounting layers that have heretofore been necessary.

The invention is thus effective as integration techniques for improving the MMIC technology, which previously has not been suited for assembling passive elements although it is suited for the integration of active circuits. The invention brings about many advantages such as reduction in circuit size and reduction of cost in processes involved in accommodating and mounting the module, which is very beneficial in industries.

Now, details of the microwave circuit connection structure used for connecting the above explained microwave circuit module with external circuitry is explained.

The composite microwave circuit module fabricated as above has neither projecting pins nor leads, but only an electrode to become the connecting terminal provided at a back surface of the substrate. Thus, connection of the module to external circuitry is realized by using the connection structure having a contact member capable of being in elastic contact with the connection terminal of the module. The composite microwave circuit module which is free from any projecting pin or lead and which is like a flat plate is very easily handled in the production process. It is a feature of the composite microwave circuit module of the invention that microwave signals are confined within a multi-layer ceramic substrate and that there is no electric opening portion other than that for connection to the external circuitry. By connecting this substrate which is shielded from the outside to a microwave circuit connection structure having a line or pattern structure, which is also shielded from the outside, it is possible to realize a small size microwave circuit connecting and mounting structure which does not require any shield case and is very simple. The shield case is large in size and is a great cause of complicating the assembling. In this viewpoint, it is very useful if a microwave circuit can be constructed without any shield case.

Figure 8:
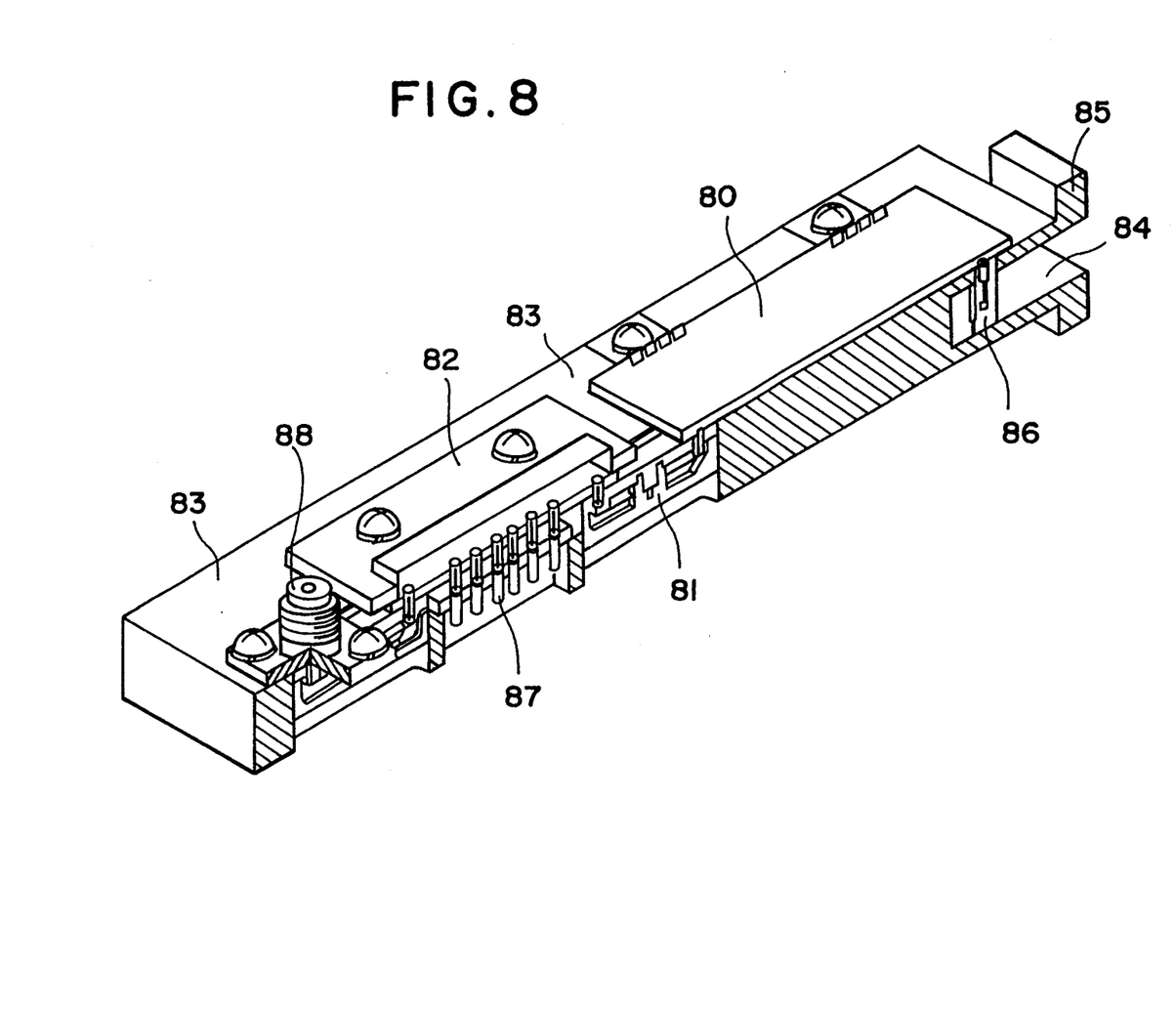
FIG. 8 is a perspective view, partly in section, of a structure of the embodiment according to the invention, intended to illustrate a connection structure and configuration.

FIG. 8 is a perspective view showing, partly in section, the composite microwave circuit module 80 and the microwave circuit connection structure 81. Designated at 83 is a plate for mounting the entire microwave circuit thereon, which may be made of metal or nonmetal. In the example shown here, one end of a microwave signal terminal of composite microwave circuit module 80 is connected to a waveguide 84. Further, connection to an external circuitry is done by a waveguide flange 85. Designated at 86 is a waveguide connection terminal which is connected by an elastic contact to the waveguide 84.

The composite microwave circuit module may be used with another module of the same or similar configuration or may be used in combination with a conventional MIC (Microwave Integrated Circuit) or MMIC module accommodated in an air-tight sealed header. In FIG. 8, designated at 82 is a conventional MIC accommodated in the header. Also, designated at 87 are DC and low frequency signal pins each of which is connected to a printed circuit board through a receptacle connector. Designated at 88 is a coaxial connector.

Figure 9:
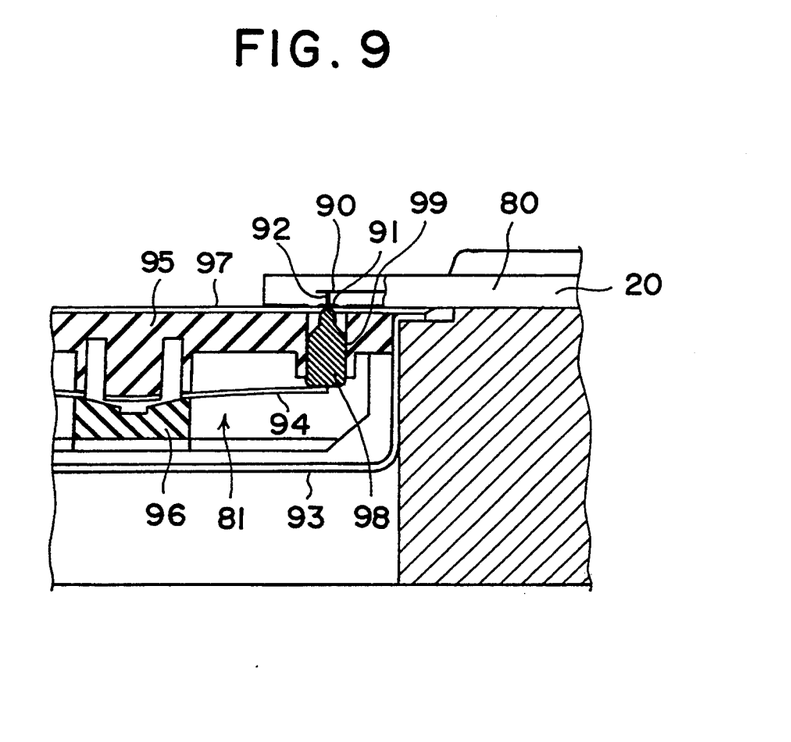
FIG. 9 is an enlarged view, partly in section, of a part of a microwave circuit connector, illustrating a state in which the composite microwave circuit module and the microwave circuit connector are assembled together.
Figure 11:
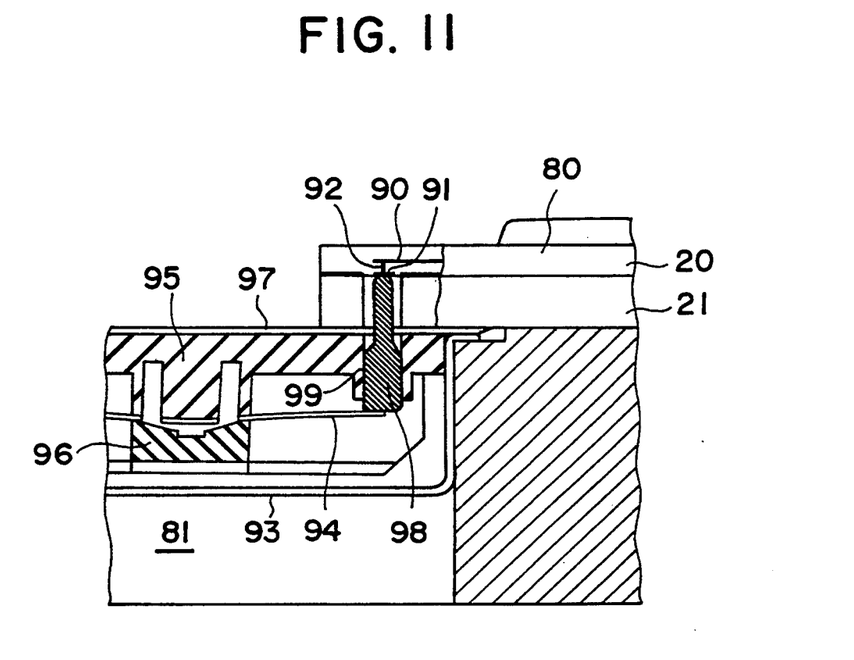
FIG. 11 is an enlarged view, partly in section, of a part of a microwave circuit connector similar to FIG. 9 but different in the existence of an additional metal base plate.

FIG. 9 shows in enlarged view a part of the microwave circuit module 80 and a part of the microwave circuit connector 81. FIG. 10 shows in perspective view a back surface of the microwave circuit module of the invention. FIG. 11 shows a structure similar to that shown in FIG. 9 with the difference being that the module 80 comprises, in addition to the sole multi-layer ceramic substrate 20, a bonded metal base plate 21 which improves the heat conduction characteristics and enhances the mechanical strength. Designated at 90 is a strip line center conductor one end of which is connected or coupled to the RF signal layer 41 or 42 shown in FIG. 4 and the other end of which is connected to a connection terminal 91 through a VIA-hole 92 filled with a conductor.

The bottom surface of the multi-layer ceramic substrate 80 is covered by a grounding conductor film except the portion around the terminal 91 for connection to the external circuitry as shown in FIG. 10 which illustrates a back surface view of the module. The microwave circuit connector 81 comprises a shield case 93 accommodating a contact leaf spring (also serving as a center conductor) 94 and insulating supports 95 and 96 for supporting the spring 94. The center conductor 94 is shielded from the outside by a shield cover 97 which shields the opening of the shield case 93 and which also serves as a conductor line connected to an outer conductor of the transmission line. Between the contact leaf spring 94 and the terminal 91 on the back surface of the substrate, a piston-like contact 98 is inserted for sliding in the axial direction by a guide sleeve 99 provided on the insulating support 95, thus achieving an electrical continuity between the terminal 91 and the contact leaf spring 94. A force due to a bending displacement of the contact leaf spring 94 produces a contact pressure for the piston-like contact 98 to be in contact with the terminal 91 and hence with the center conductor 90.

Figure 12:
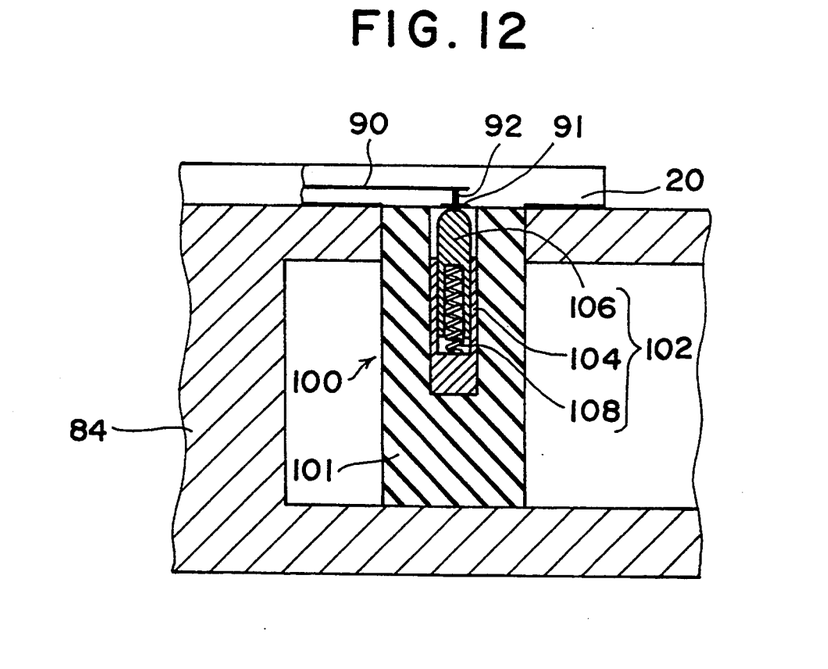
FIG. 12 is an enlarged sectional view of a part of a microwave circuit connector in which a coil spring is utilized, illustrating a state in which the composite microwave circuit module is connected with a waveguide.
Figure 13:
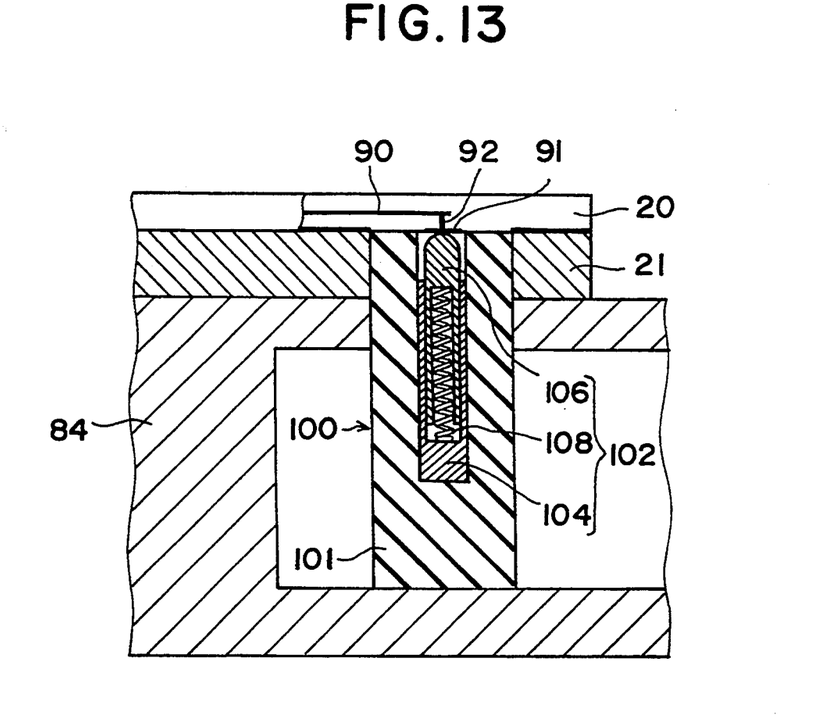
FIG. 13 is an enlarged view partly in section of a part of a microwave circuit connector similar to FIG. 12 but different in the existence of an additional metal base plate.

FIGS. 12 and 13 are enlarged sectional views for explaining the structure of connection between the microwave terminal 91 on the substrate 20 of the composite microwave circuit module 80 and the waveguide 84. Here, too, the difference between the structure shown in FIG. 12 and that shown in FIG. 13 is that the sole substrate 20 is used in the former and a metal base plate 21 is bonded to the substrate 20 in the latter.

While it has been shown in connection with FIGS. 9 and 11 that the strip line center conductor 90 in the substrate 20 and the terminal 91 on the substrate surface 20 are connected to each other via the via-hole 92 filled with a conductor, entirely the same structure is used in the case of connection to the waveguide 4. The sole difference is that a waveguide connector 100 is used instead of the microwave circuit connector 81.

Figure 14:
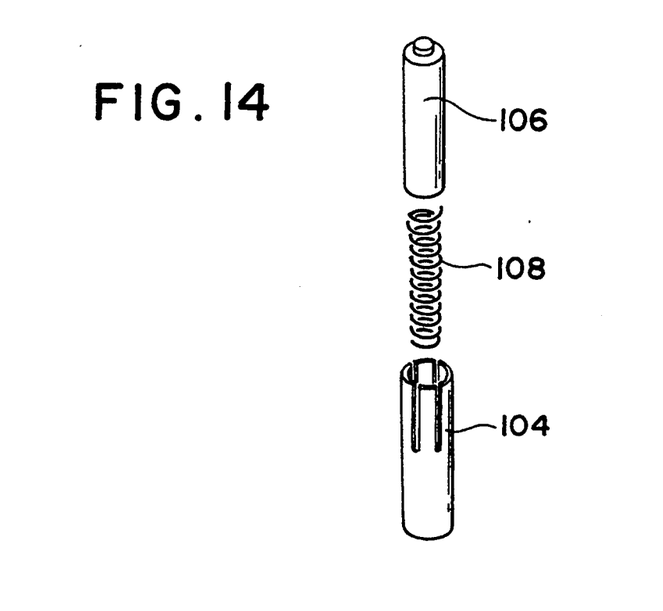
FIG. 14 is an exploded perspective view of a center conductor of a waveguide connector.

The structure of the waveguide connector 100 will now be described. The waveguide connector 100 is formed by a dielectric member 101 and a center conductor 102. The top surface of the dielectric member 101 abuts the bottom surface of the substrate 20. The center conductor 102 comprises an outer sleeve 104, an inner sleeve 106, and a coil spring 108. The inner sleeve 106 is slidably inserted into the outer sleeve 104. The coil spring 108 is assembled in both the sleeves to axially force apart the two sleeves 104 and 106. Although the constituents of the center conductor 102 are allowed to move or slide relative to one another, they should be electrically unitary. To this end, the outer sleeve 104 is formed with slits as shown in FIG. 14 so that satisfactory electrical contact between the two sleeves is achieved. This structure permits the composite microwave circuit module 80 and the waveguide 84 to be connected with each other very easily.

Figure 15:
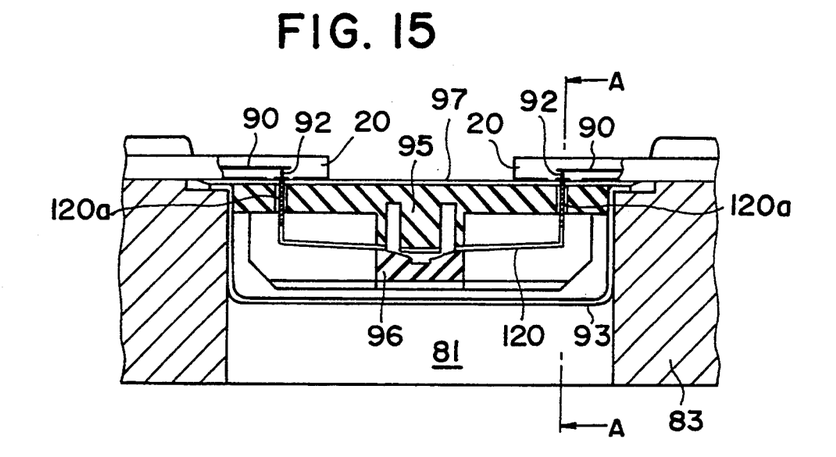
FIG. 15 is an enlarged sectional view of a modified structure of a microwave circuit connector portion as an embodiment according to the invention.
Figure 16:
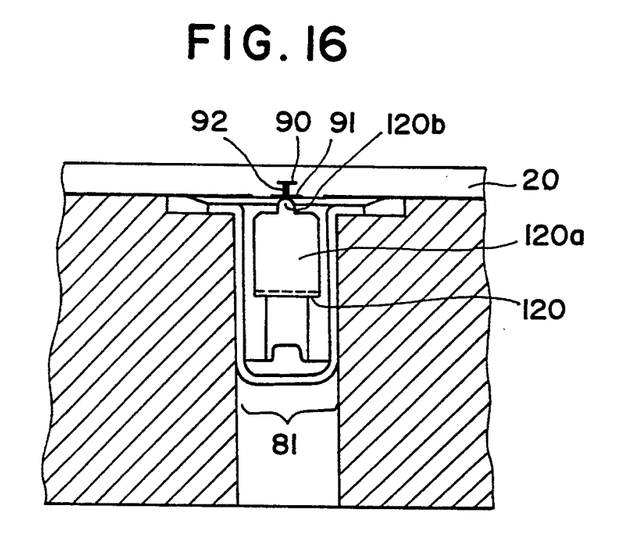
FIG. 16 is an enlarged sectional view taken along line A—A in FIG. 15.

While preferred embodiments of the microwave circuit connection structure according to the invention have been described above, various modifications or developed forms of the embodiments are conceivable. FIG. 15 shows a structure adopting a leaf spring center conductor 120 having an integral contact 120a at each end thereof. This example comprises less components and has less electric discontinuity for the transmission line as compared to the previous embodiments. FIG. 16 is a section taken along line A—A in FIG. 15 for illustrating the contact portions in detail. As shown therein, an end portion 120b of the center conductor 120 in the form of a leaf spring is in elastic contact with a microwave terminal 91 of a composite microwave circuit module 80.

Figure 17:
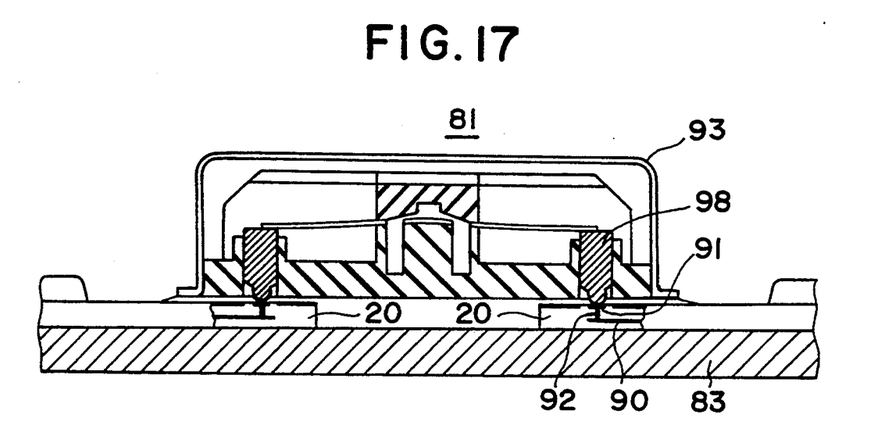
FIG. 17 is a view of a connection structure in which the composite microwave circuit module and the microwave circuit connector are connected in an inverted position as another embodiment according to the invention.

Another modification possible relates to a way in which the microwave circuit connector is disposed. In the embodiments described before, the microwave circuit connector 81 is buried in the circuit mounting plate 83. However, there are cases where it is not desired to have it buried in the circuit mounting plate 83, such as where a waveguide circuit or the like is buried in the mounting plate 83. In such a case, as seen in FIG. 17, a center conductor 90 in a substrate 20 is led through a via-hole 92 to a microwave terminal 91 on the top surface of the substrate 20.

Figure 18A:
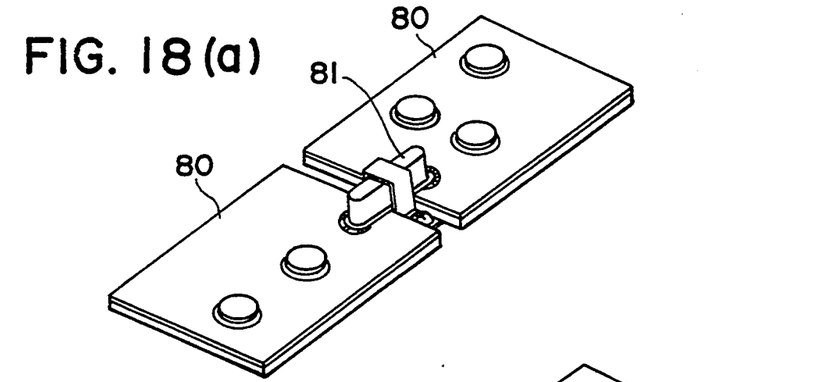
FIGS. 18(a) and 18(b) are perspective views of a structure used for a top surface connection as a further embodiment according to the invention, FIG. 18(a) showing the state in which the circuit connector has been assembled and FIG. 18(b) showing the state before the assembling.
Figure 18B:
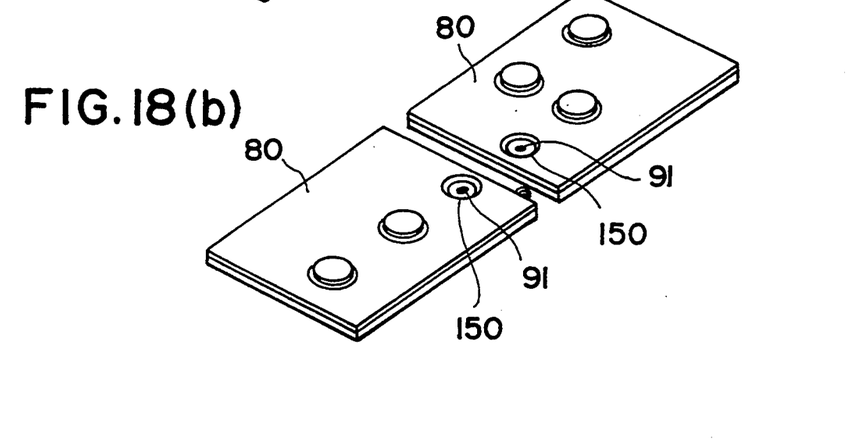

FIGS. 18(a) and 18(b) are perspective views showing an example of a top surface connection system. A microwave connector 81 is inserted in shallow recesses or depressions 150 for positioning, each of which is provided on the substrate top surface with a microwave terminal 91 as the center, and is secured by applying pressure. The depressions 150 are positioning means for attaining accurate contact connection and reducing the discontinuity of the transmission line.

According to the invention, a plurality of composite microwave circuit modules may be assembled into a microwave circuit of a greater scale, thereby permitting signal coupling, which is stable and has satisfactory RF characteristic (i.e., with less discontinuity) and which is achieved by use of contact connection in lieu of connection by soldering which has great characteristic fluctuations.

Further, in addition to the high performance and stable coupling noted above, the microwave circuit connection structure according to the invention permits extreme reduction in circuit size by dispensing with the large and bulky shield case and without use of any cable connector. This, along with contribution to the size reduction of the composite microwave circuit module, permits realization of extreme size reduction of apparatuses, such as transmitter and receiver modules of electronic scanning antennas and microwave and milliwave communication apparatuses.

With the connecting and mounting structure described above, it is easy to replace a malfunctioning composite circuit module with new one. This has great effects in replacement of modules in production lines and also repair of modules in fields or service centers. Further, because of stable connection performance, it is only necessary to make mechanical replacement of modules, and no adjustment is needed.

As has been described, although the structure for connecting and mounting microwave circuits according to the invention is most effective when applied to composite microwave circuit modules, this application is by no means limited only to that herein described.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A composite microwave circuit module assembly comprising:
   a dielectric substrate formed by lamination of a plurality of layers comprising a lower layer, an intermediate layer and an upper layer, said lower layer and said upper layer including a lower ground surface and an upper ground surface, respectively, and said intermediate layer including a radio frequency signal circuit for radio frequency signal transmission, formed by radio frequency wiring layers, said radio frequency signal circuit including an active circuit element and a passive circuit element electrically connected to each other so as to form an integral structure;

a wiring layer provided on said radio frequency wiring layers, said wiring layer accommodating patterns including a power source pattern for a microwave circuit and a wiring pattern for control signals, said wiring layer being independent from said radio frequency wiring layers;

a number of via-holes arranged along said radio frequency signal circuit and filled with metal to short-circuit said upper ground surface and said lower ground surface, said radio frequency signal circuit being shielded by said via-holes; and an element mounting cavity disposed on said intermediate layer with a portion of dielectric above said intermediate layer being removed, and within which said active circuit element is mounted, said element mounting cavity being covered by a conductor plate member.

2. A composite microwave circuit module assembly according to claim 1, wherein said element mounting cavity has an element-mounting conductor land on said intermediate layer, said element-mounting conductor land being connected to said lower ground surface by a plurality of thermal via-holes filled with metal, to reduce thermal resistance and to enhance heat conduction to said lower layer.

3. A composite microwave circuit module assembly according to claim 1, further comprising a thin dielectric film formed in said intermediate layer, said thin dielectric film having on its two opposite sides conductive patterns to form a capacitive coupling thereby forming a transmission line capable of blocking a direct-current component.

4. A composite microwave circuit module assembly according to claim 1, further comprising a metal base plate which is welded to said dielectric substrate to enhance heat spread and mechanical strength.

5. A composite microwave circuit module assembly according to claim 1, further comprising a connection terminal coupled to said radio frequency signal circuit and disposed in a surface portion of said dielectric substrate without projecting from a surface thereof and allowing external electrical connection thereat from outside.

6. A composite microwave circuit module assembly comprising:

a dielectric substrate formed by lamination of a plurality of layers comprising a lower layer, an intermediate layer and an upper layer, said lower layer and said upper layer including a lower ground surface and an upper ground surface, respectively, and said intermediate layer including a radio frequency signal circuit for radio frequency signal transmission, formed by at least one conductive layer, said radio frequency signal circuit including an active circuit element and a passive circuit element electrically connected to each other so as to form an integral structure;

a number of via-holes arranged along said radio frequency signal circuit and filled with metal to short-circuit said upper ground surface and said lower ground surface, said radio frequency circuit being shielded by said via-holes; and an element mounting cavity disposed on said intermediate layer with a portion of dielectric above said intermediate layer being removed, and within which said active circuit element is mounted, said element mounting cavity being covered by a conductor plate member, said active circuit element including a voltage controlled oscillator, an amplifier, a pre-scaler, a mixer, a variable attenuator, a power amplifier and a detector formed by a microwave monolithic integrated circuit, an integrated circuit, at least one of a transistor and a diode, and said passive circuit element including a directional coupler, a band-pass filter and a low-pass filter formed by at least one of a strip line, a microstrip line and a coplanar line.

7. A composite microwave circuit module assembly comprising:

a dielectric substrate formed by lamination of a plurality of layers comprising a lower layer, an intermediate layer and an upper layer, said lower layer and said upper layer including a lower ground surface and an upper ground surface, respectively, and said intermediate layer including a radio frequency signal circuit for radio frequency signal transmission, formed by at least one conductive layer, said radio frequency signal circuit including an active circuit element and a passive circuit element electrically connected to each other so as form an integral structure;

a number of via-holes arranged along said radio frequency signal circuit and filled with metal to short-circuit said upper ground surface and said lower ground surface, said radio frequency circuit being shielded by said via-holes;

an element mounting cavity disposed on said intermediate layer with a portion of dielectric above said intermediate layer being removed, and within which said active circuit element is mounted, said element mounting cavity being covered by a conductor plate member, said element mounting cavity having an element mounting conductor land on said intermediate layer, said element mounting conductor land being connected to said lower ground surface by a plurality of thermal via-holes filled with metal, to reduce thermal resistance and to enhance heat conduction to said lower layer; and a plurality of conductive lands formed of conductive layers between said element mounting conductor land and said lower ground surface, said conductive lands being alternatively arranged as capacitor lands and grounds lands, said capacitor lands being connected together and said ground lands and said lower ground surface being connected together, respectively, via a plurality of thermal via-holes filled with metal to form a laminate capacitor which serves as a by-pass capacitor for an element mounted on said element mounting conductor land and which serves to disperse heat laterally and to reduce thermal resistance.

8. A composite microwave circuit module assembly according to claim 7, wherein each of said thermal via-holes is located right beneath a local heat generation spot of said active circuit element mounted on said element-mounting conductor land.

9. A composite microwave circuit module assembly comprising:

a dielectric substrate formed by lamination of a plurality of layers comprising a lower layer, an intermediate layer and an upper layer, said lower layer and said upper layer including a lower ground surface and an upper ground surface, respectively, and said intermediate layer including a radio frequency signal circuit for radio frequency signal transmission, formed by at least one conductive layer, said radio frequency signal circuit including an active circuit element and a passive circuit element electrically connected to each other so as to form an integral structure;

a number of via-holes arranged along said radio frequency signal circuit and filled with metal to short-circuit said upper ground surface and said lower ground surface, said radio frequency circuit being shielded by said via-holes;

an element mounting cavity disposed on said intermediate layer with a portion of dielectric above said intermediate layer being removed, and within which said active circuit element is mounted, said element mounting cavity being covered by a conductor plate member; and a wiring layer on said upper layer with a dielectric layer being interposed therebetween and a conductor land located at a portion where said wiring layer is connected to said radio frequency signal circuit in said intermediate layer, said conductor land and said upper ground surface right beneath said conductor land forming a capacitor to block a radio frequency signal leakage from said intermediate layer.

10. A composite microwave circuit module assembly comprising:

a dielectric substrate formed by lamination of a plurality of layers comprising a lower layer, an intermediate layer and an upper layer, said lower layer and said upper layer including a lower ground surface and an upper ground surface, respectively, and said intermediate layer including a radio frequency signal circuit for radio frequency signal transmission, formed by at least one conductive layer, said radio frequency signal circuit including an active circuit element and a passive circuit element electrically connected to each other so as to form an integral structure, each of said lower, intermediate and upper layers being provided with distributed small cavities with dielectric in each of said layers being removed;

a number of via-holes arranged along said radio frequency signal circuit and filled with metal to short-circuit said upper ground surface and said lower ground surface, said radio frequency circuit being shielded by said via-holes; and an element mounting cavity disposed on said intermediate layer with a portion of dielectric above said intermediate layer being removed, and within which said active circuit element is mounted, said element mounting cavity being covered by a conductor plate member.

11. A composite microwave circuit module assembly comprising:

a dielectric substrate formed by lamination of a plurality of layers comprising a lower layer, an intermediate layer and an upper layer, said lower layer and said upper layer including a lower ground surface and an upper ground surface, respectively, and said intermediate layer including a radio frequency signal circuit for radio frequency signal transmission, formed by at least one conductive layer, said radio frequency signal circuit including an active circuit element and a passive circuit element electrically connected to each other so as to form an integral structure;

a number of via-holes arranged along said radio frequency signal circuit and filled with metal to short-circuit said upper ground surface and said lower ground surface, said radio frequency circuit being shielded by said via-holes;

an element mounting cavity disposed on said intermediate layer with a portion of dielectric above said intermediate layer being removed, and within which said active circuit element is mounted, said element mounting cavity being covered by a conductor plate member;

a connection terminal coupled to said radio frequency signal circuit and disposed in a surface portion of said dielectric substrate without projecting from a surface thereof and allowing external electrical connection thereat from outside; and a microwave circuit connection structure for connecting said connection terminal to a terminal of other external circuitry, said microwave connection structure having therein a contact member which is resiliently urged toward said connection terminal.

12. A composite microwave circuit module assembly according to claim 10, wherein said small cavities are shifted in position for each of said layers to avoid overlap.

13. A composite microwave circuit module assembly according to claim 11, wherein said contact member comprises a piston-like conductor pin urged to said connection terminal by a leaf spring conductor.

14. A composite microwave circuit module assembly according to claim 13, wherein said leaf spring conductor and said contact member are accommodated in a shield case.

15. A composite microwave circuit module assembly according to claim 11, wherein said contact member comprises outer and inner conductor sleeves which are telescoped with a spring member enclosed therein.

16. A composite microwave circuit module assembly according to claim 15, wherein each of said outer conductor sleeves has a plurality of slit portions at its periphery.

17. A composite microwave circuit module assembly according to claim 11, wherein said contact member is constituted by a plate spring which integrally forms both the contact member and a conductor spring member urging said the contact member toward said connection terminal.

* * * * *